(12) United States Patent
Oh et al.

(10) Patent No.: US 8,399,801 B2
(45) Date of Patent: Mar. 19, 2013

(54) METHOD OF MANUFACTURING PRINTED CIRCUIT BOARD

(75) Inventors: Hwa-Sub Oh, Gyunggi-do (KR); Young-Hwan Shin, Gyunggi-do (KR); Jung-Woo Cho, Gyunggi-do (KR); Sung-Jin Lim, Gyunggi-do (KR)

(73) Assignee: Samsung Electro-Mechanics Co., Ltd, Gyunggi-Do (KR)

( * ) Notice: Subject to any disclaimer, the term of this patent is extended or adjusted under 35 U.S.C. 154(b) by 317 days.

(21) Appl. No.: 12/759,083

(22) Filed: Apr. 13, 2010

(65) Prior Publication Data

US 2010/0258545 A1 Oct. 14, 2010

(30) Foreign Application Priority Data

Apr. 14, 2009 (KR) .......................... 10-2009-0032302
Apr. 1, 2010 (KR) .......................... 10-2010-0029838

(51) Int. Cl.
*B23K 26/38* (2006.01)

(52) U.S. Cl. ............... 219/121.72; 219/121.71; 228/164

(58) Field of Classification Search .............. 219/121.7, 219/121.71, 121.72; 228/164
See application file for complete search history.

(56) References Cited

U.S. PATENT DOCUMENTS

| | | | | |
|---|---|---|---|---|
| 6,802,445 | B2 * | 10/2004 | Shim et al. ................. | 228/123.1 |
| 7,485,563 | B2 * | 2/2009 | Pang et al. .................... | 438/613 |
| 7,626,829 | B2 * | 12/2009 | Watanabe et al. ............ | 361/767 |
| 7,660,129 | B2 * | 2/2010 | Minota et al. ................ | 361/767 |

* cited by examiner

*Primary Examiner* — Roy Potter
(74) *Attorney, Agent, or Firm* — McDermott Will & Emery LLP

(57) ABSTRACT

A method of manufacturing a printed circuit board is disclosed. The method in accordance with an embodiment of the present invention includes providing an insulation layer having a first area and a second area formed thereon, forming a solder resist layer on the insulation layer, in which the solder resist layer has a first opening formed thereon and the first opening exposes the first area, forming a first surface treatment layer on the first area inside the first opening, forming a second opening on the solder resist layer, in which the second opening exposes the second area, and forming a second surface treatment layer on the second area inside the second opening.

5 Claims, 14 Drawing Sheets

METHOD OF MANUFACTURING PRINTED CIRCUIT BOARD

CROSS-REFERENCE TO RELATED APPLICATIONS

This application claims the benefit of Korean Patent Application Nos. 10-2009-0032302 and 10-2010-0029838, filed with the Korean Intellectual Property Office on Apr. 14, 2009 and Apr. 1, 2010, the disclosure of which is incorporated herein by reference in their entirety.

BACKGROUND

1. Technical Field

The present invention is related to a method of manufacturing a printed circuit board.

2. Description of the Related Art

In step with the trends toward higher-speed and higher-integration semiconductor package substrate and with the method of connection with a semiconductor developing from the conventional wire bonding to the new flip-chip bonding, there is a growing demand for application of different types of surface treatment on a single printed circuit board. Moreover, a more precise design is required for a certain area of the printed circuit board than other areas.

To address the demands for a design that applies different types of surface treatment to one substrate or enhances the precision of a certain area, it is needed to develop an improved method that is different from the conventional method.

FIGS. 1 to 8 show the process flow of a method of manufacturing a printed circuit board in accordance with the related art. In the conventional technology, an etch-back process is used to perform different surface treatments for a wire bonding pad and a solder ball pad of the printed circuit board for semiconductor package described above. First, as illustrated in FIGS. 1 and 2, an opening is formed on a solder resist layer 15 such that a wire bonding pad 12, a solder ball pad (not shown) and a plated bus-line 14 formed on an insulation layer 11 can be exposed to the outside.

Then, as illustrated in FIGS. 3 and 4, the surfaces of the solder ball pad (not shown) and the plated bus-line 14 are covered by a plating resist 16, and a nickel layer 17 and a gold layer 18 are formed only on the surface of the wire bonding pad 12 by way of electroplating.

Then, as illustrated in FIGS. 5 to 8, after the plating resist 16 is removed, the surfaces of the solder ball pad (not shown) and the wire bonding pad 12 are covered by an etching resist 19, and the plated bus-line 14 is removed. Then, the etching resist 19 is removed.

Finally, an organic solderability preservative (OSP) layer is formed on the solder ball pad (not shown).

In the conventional technology, however, a plating resist for covering a solder ball pad and an etching resist for removing a plated bus-line are needed, increasing the number of production processes, the production time and the defect rate.

Also, since the plated bus-line is required for electroplating, disposing the circuits and pads is restricted. Although the plated bus-line is removed by the etch-back process described above, the plated bus-line would leave a residual part, as illustrated in FIG. 8, causing a noise when transmitting high-speed signals.

Therefore, surface treatment on the wire bonding pad by way of electroless plating has been attempted, but since a conventional plating resist can not survive in a plating solution for electroless plating, there has been a difficulty in employing surface treatment, for example, OSP, which is different from the one employed on the wire bonding pad, on the solder ball pad.

SUMMARY

The present invention provides a method of manufacturing a printed circuit board that can implement a printed circuit board for a package requiring various types of surface treatment more easily and accurately.

An aspect of the present invention provides a method of manufacturing a printed circuit board. The method in accordance with an embodiment of the present invention can include providing an insulation layer having a first area and a second area formed thereon, forming a solder resist layer on the insulation layer, in which the solder resist layer has a first opening formed thereon and the first opening exposes the first area, forming a first surface treatment layer on the first area inside the first opening, forming a second opening on the solder resist layer, in which the second opening exposes the second area, and forming a second surface treatment layer on the second area inside the second opening.

Each of the first area and the second area can be one of a wire bonding pad, a bump pad and a circuit pattern. The forming of the second opening can be performed by a laser.

Each of the first surface treatment layer and the second surface treatment layer can be formed by one of an electrolytic nickel-gold plating method, an electroless nickel immersion gold (ENIG) method, an electroless nickel autocatalytic gold (ENAG) method, an electroless nickel electroless palladium immersion gold (ENEPIG) method, an electroless nickel immersion palladium immersion gold (ENIPIG) method, an immersion tin plating method and an organic solderability preservative (OSP) method. The first surface treatment layer and the second surface treatment layer can be formed by methods that are different from each other.

Additional aspects and advantages of the present invention will be set forth in part in the description which follows, and in part will be obvious from the description, or may be learned by practice of the invention.

DETAILED DESCRIPTION

Figure 1:
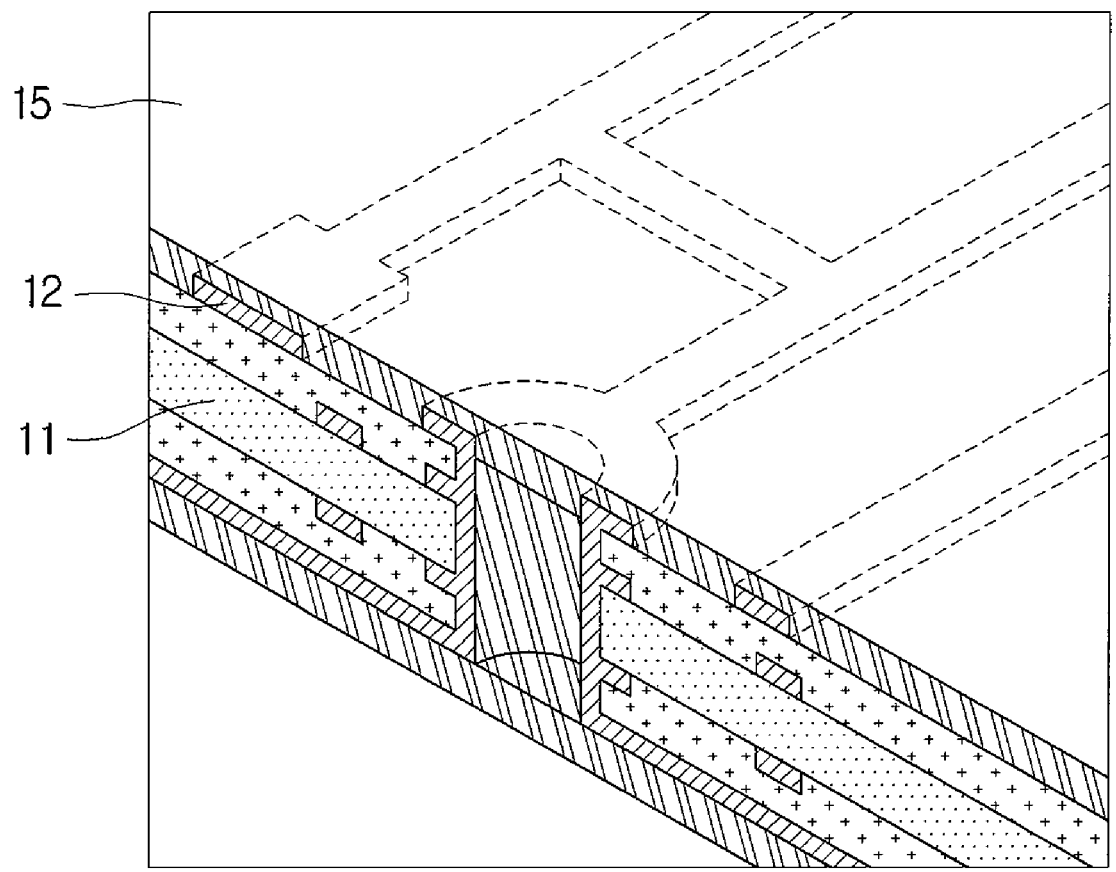
FIGS. 1 to 8 show the process flow of a method of manufacturing a printed circuit board in accordance with the related art.
Figure 2:
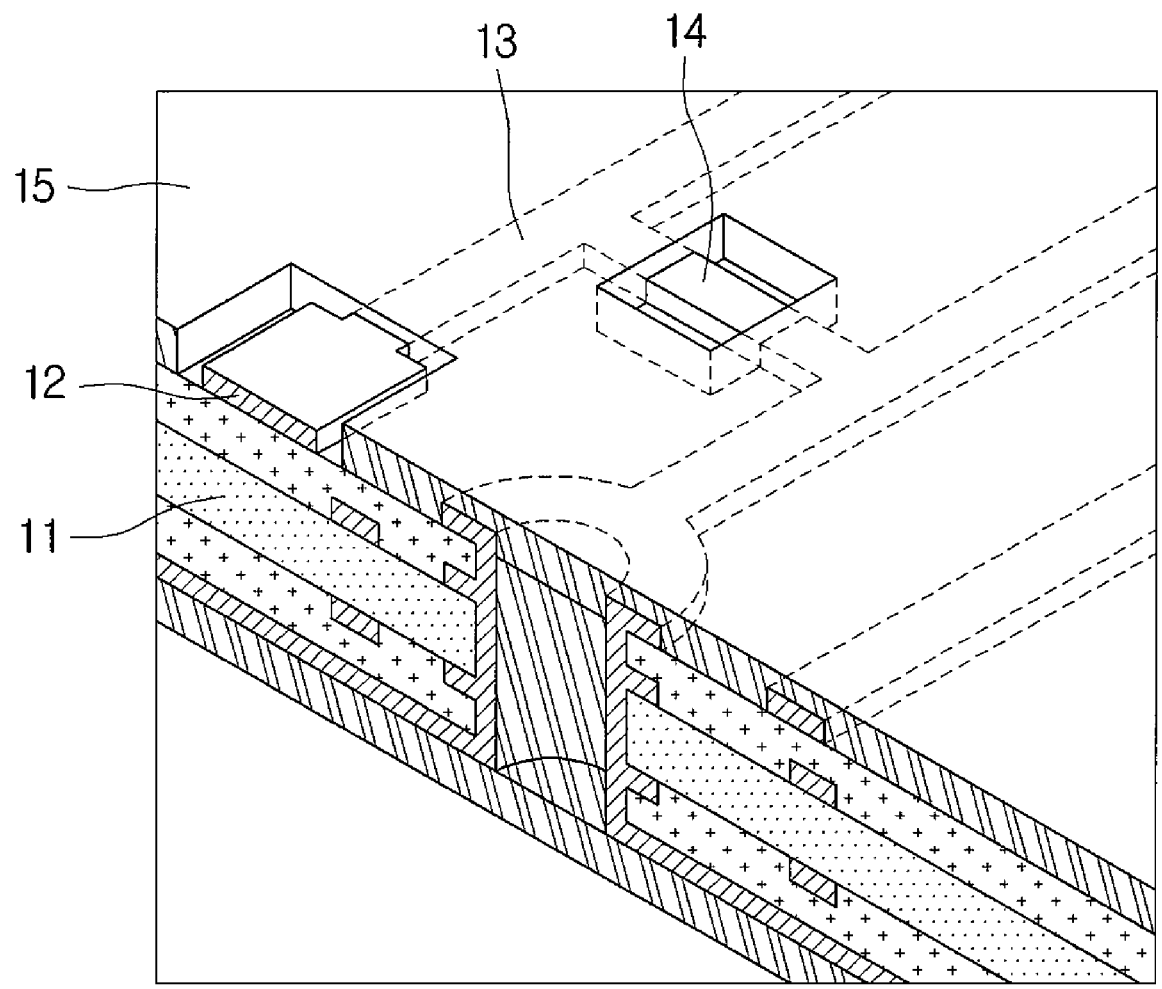
Figure 3:
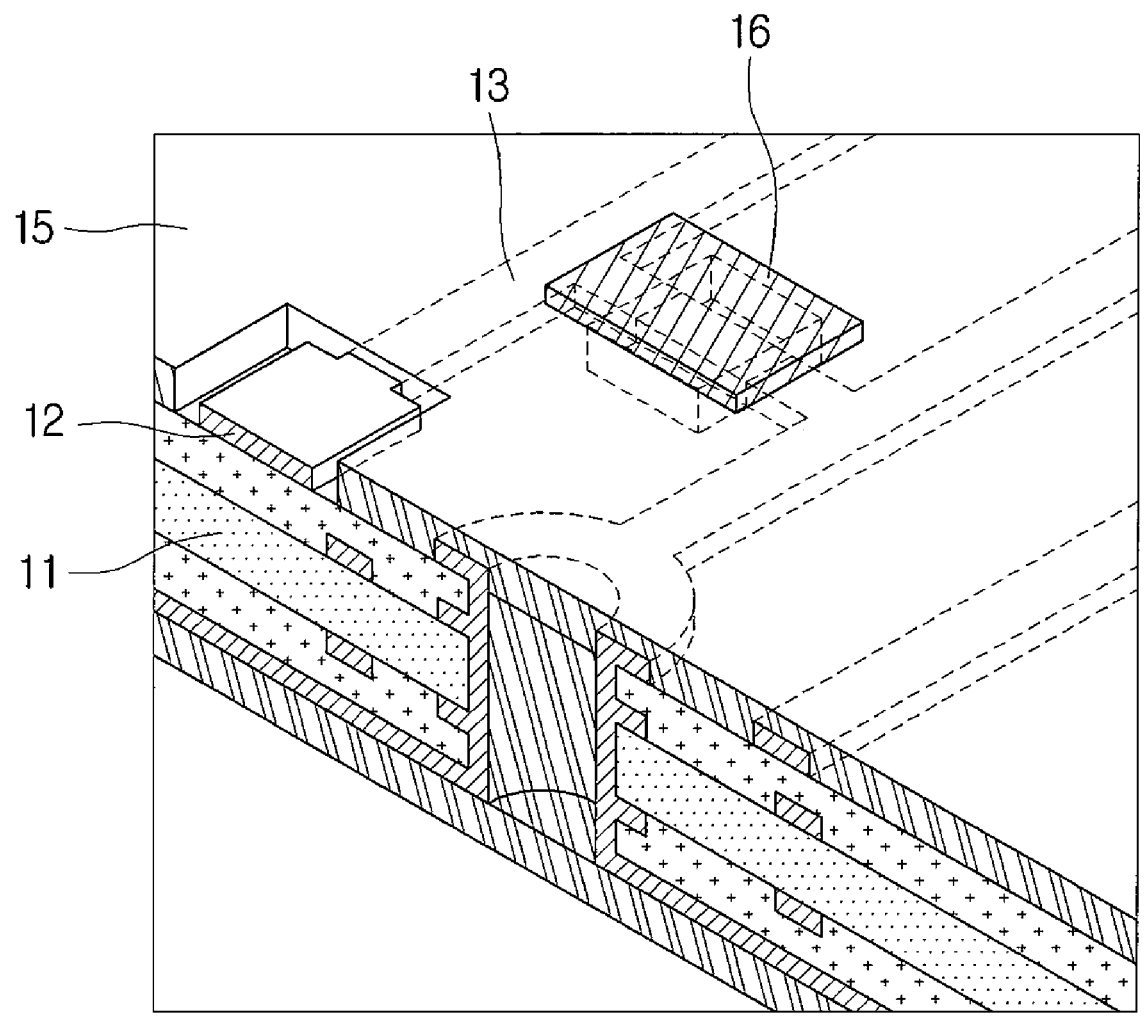
Figure 4:
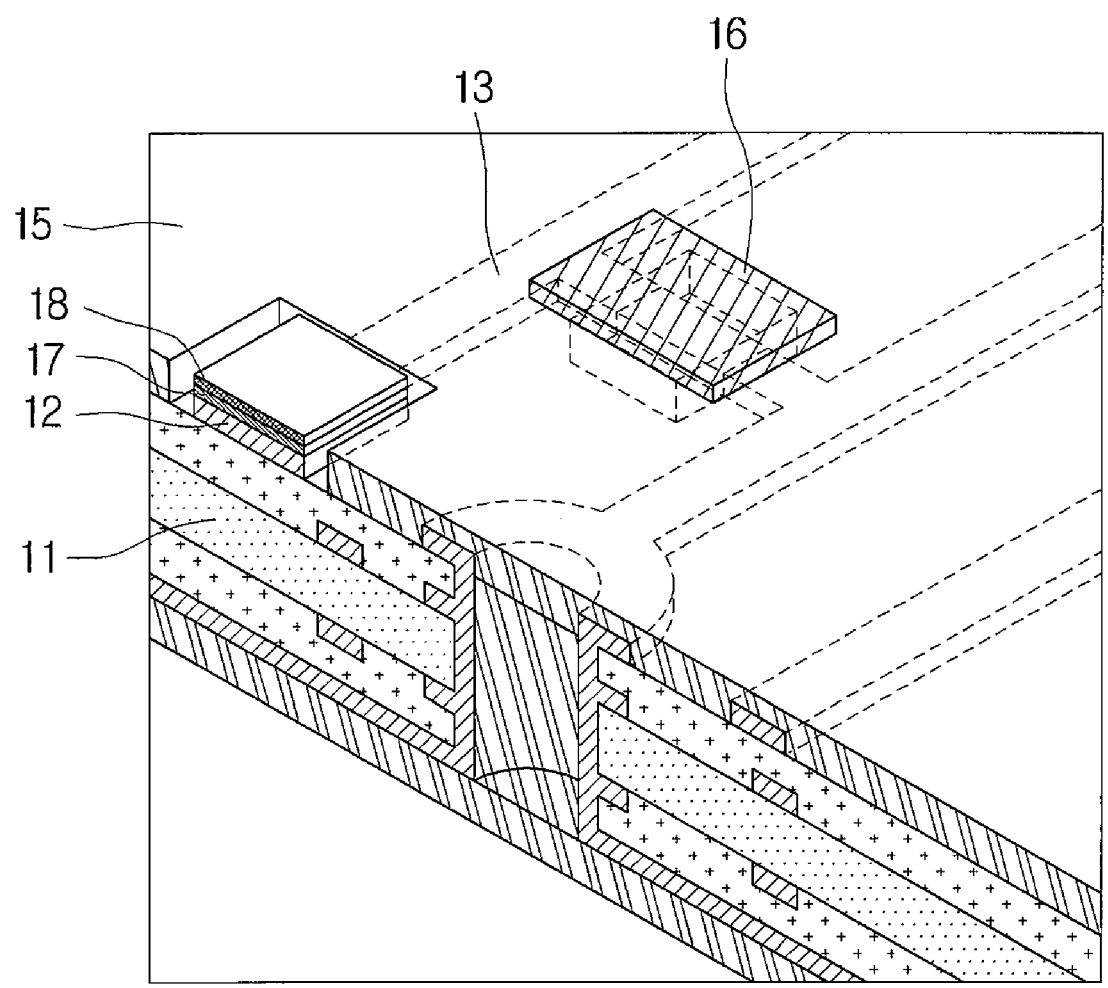
Figure 5:
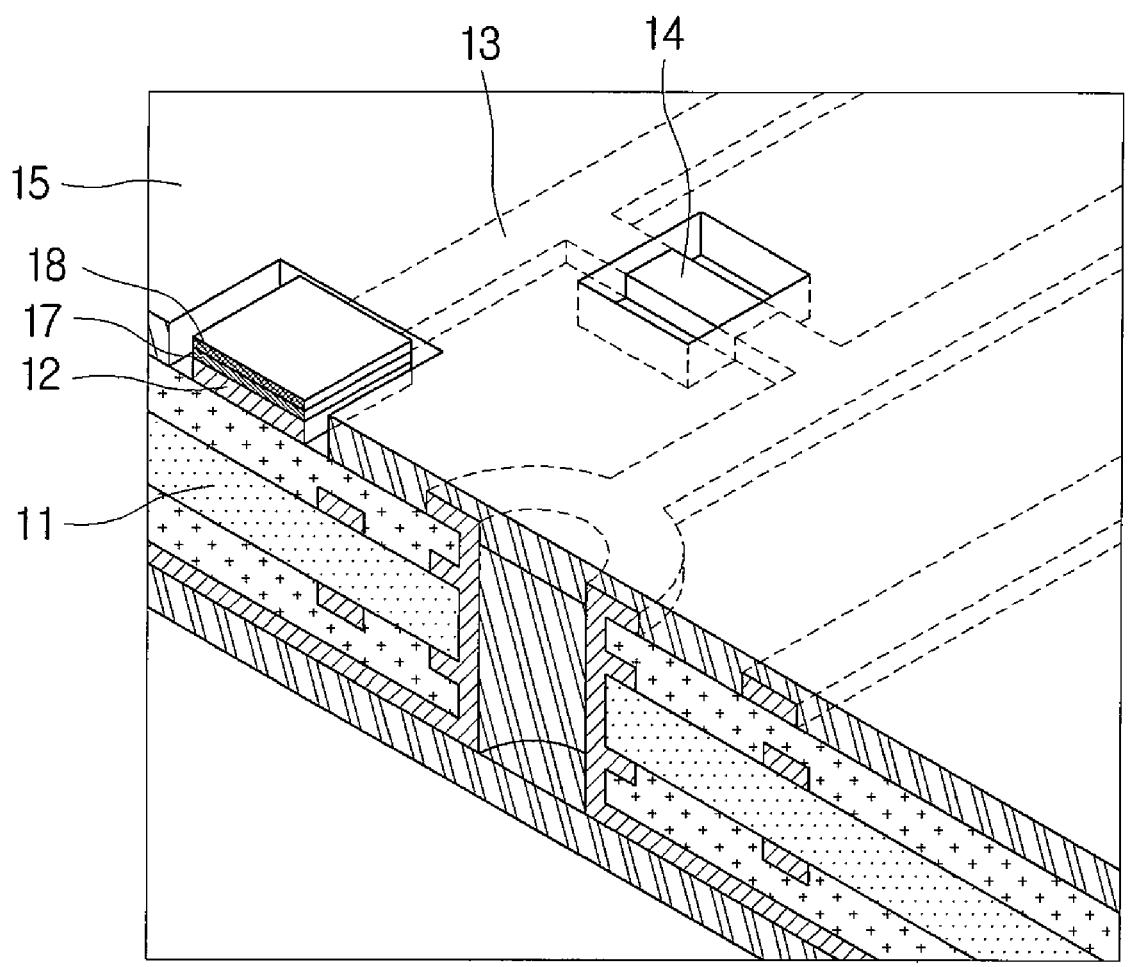
Figure 6:
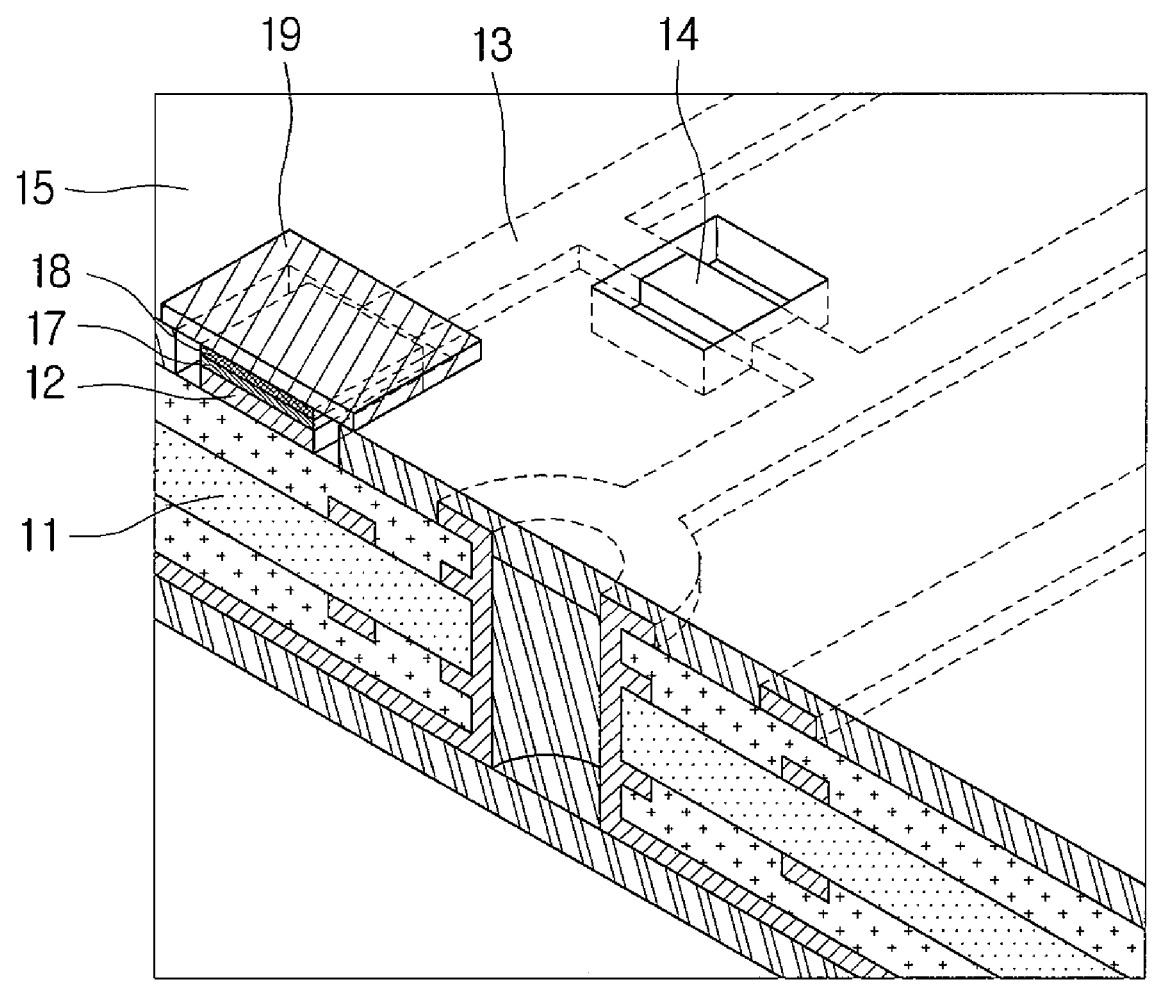
Figure 7:
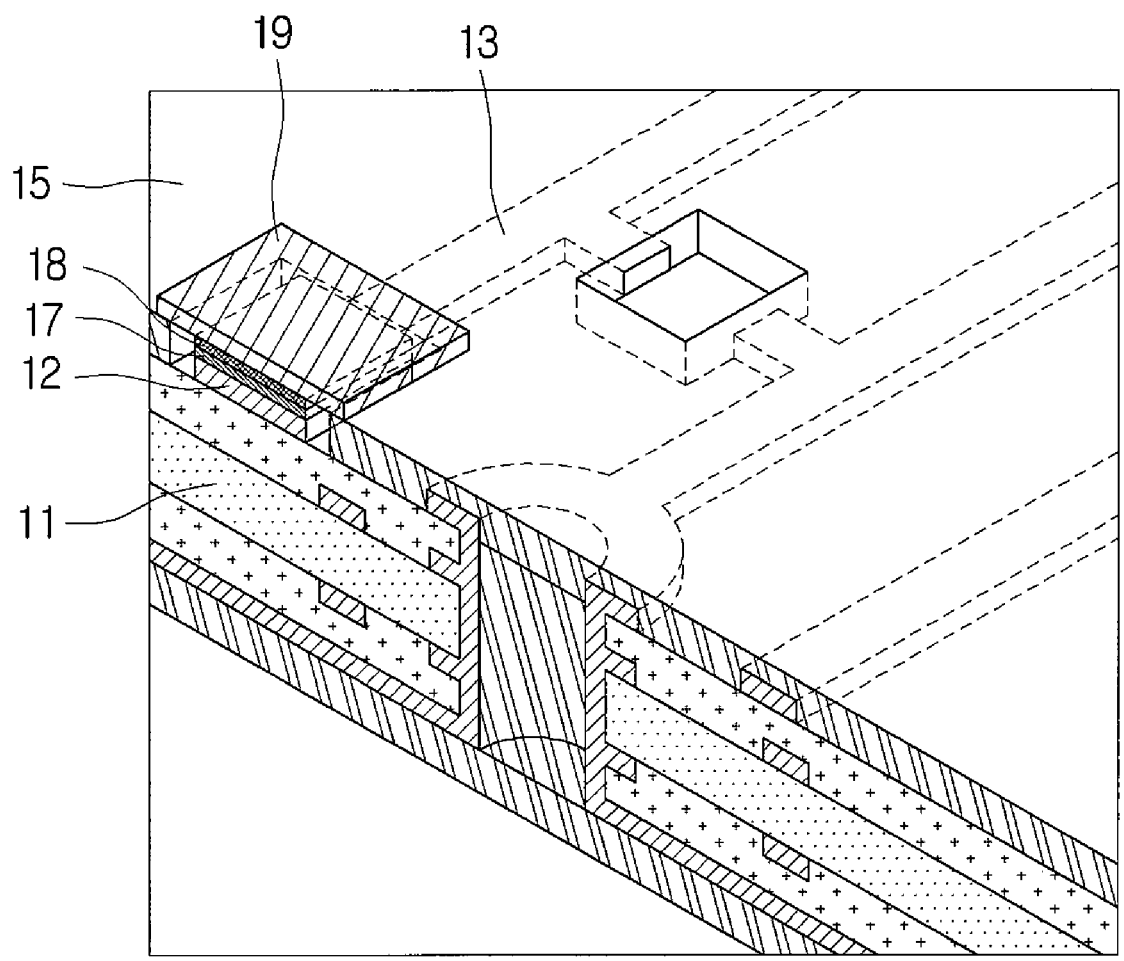
Figure 8:
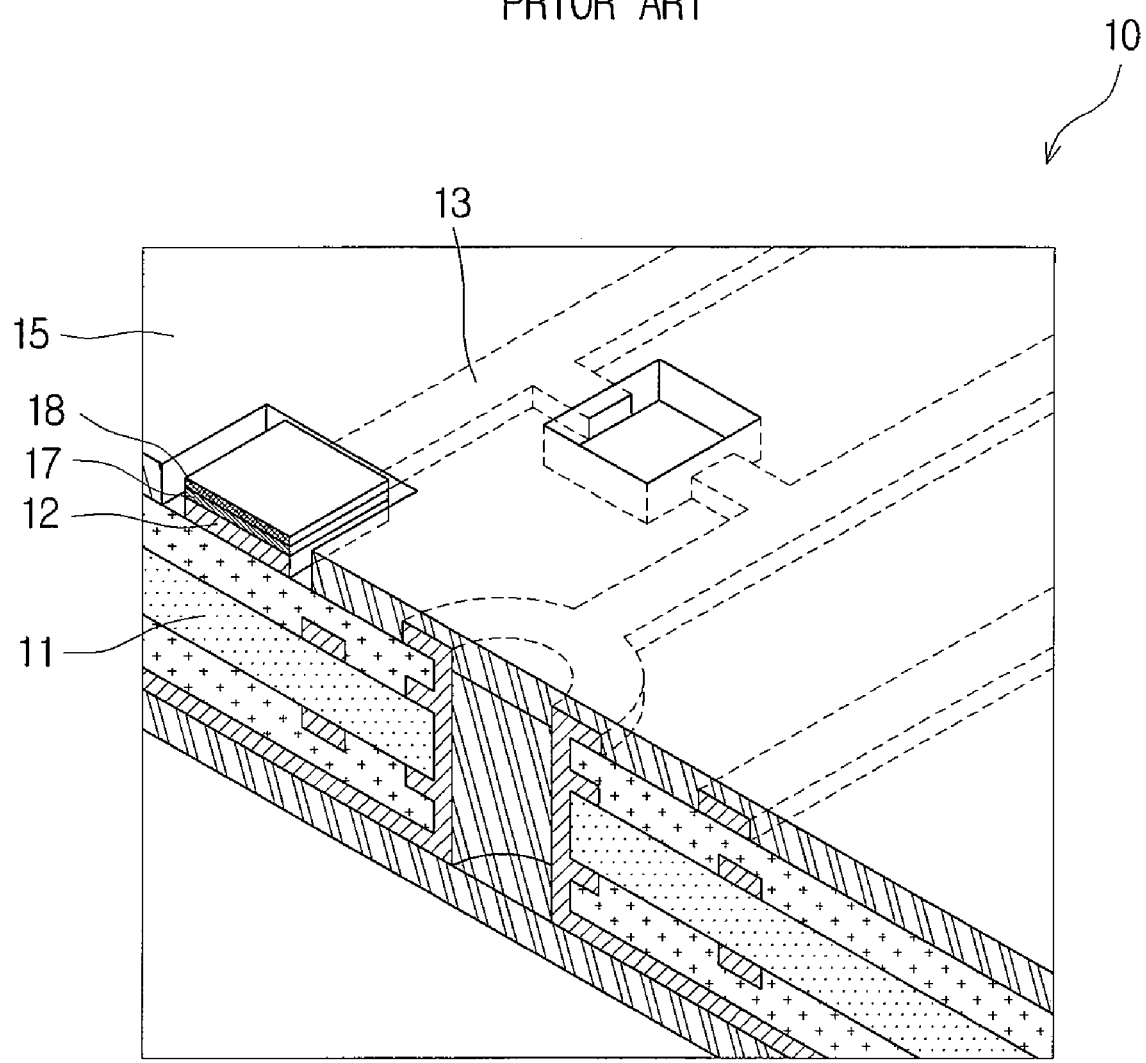

A method of manufacturing a printed circuit board according to a certain embodiment of the present invention will be described below in more detail with reference to the accompanying drawings. Those components that are the same or are in correspondence are rendered the same reference numeral regardless of the figure number, and redundant descriptions are omitted.

Figure 9:
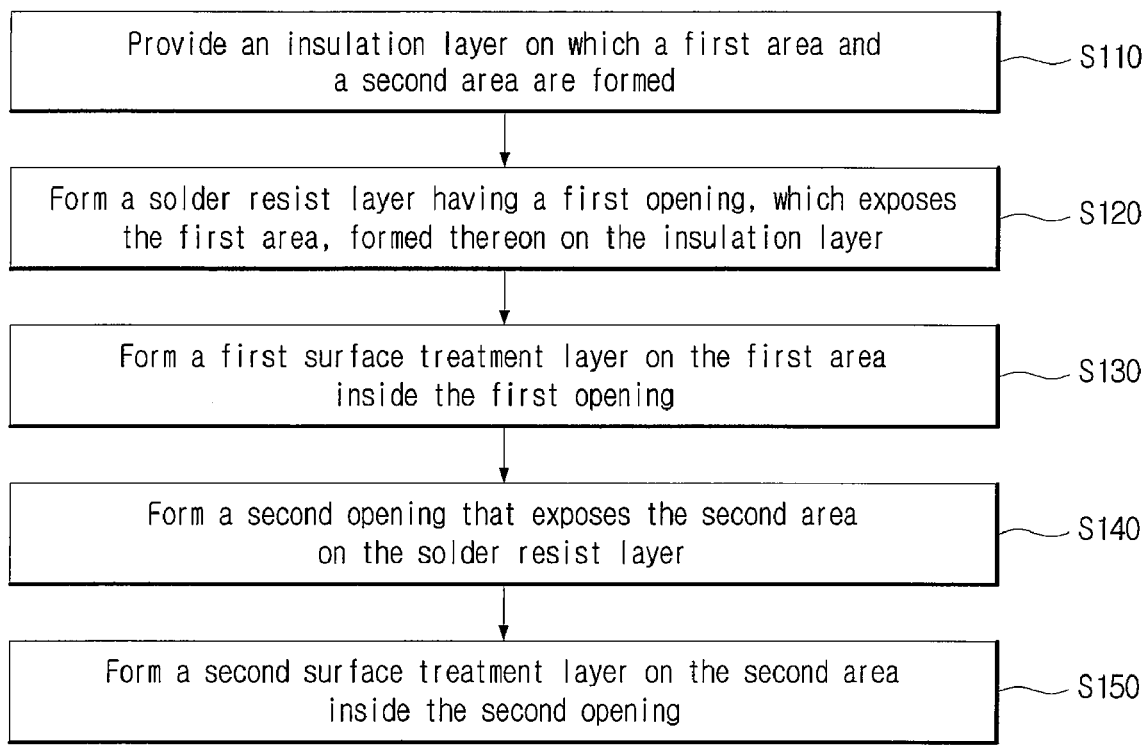
FIG. 9 is a flow diagram illustrating a method of manufacturing a printed circuit board in accordance with an embodiment of the present invention.

FIG. 9 is a flowchart illustrating a method of manufacturing a printed circuit board 100 in accordance with an embodiment of the present invention, and FIGS. 10 to 14 are cross-sectional views illustrating each respective process of the method of manufacturing the printed circuit board 100 in accordance with an embodiment of the present invention.

As illustrated in FIGS. 9 to 14, the present embodiment of the present invention provides a method of manufacturing a printed circuit board that includes providing an insulation layer 110, forming a solder resist layer 120 having a first opening 122 formed thereon on the insulation layer 110, forming a first surface treatment layer 130 on a first area 112, forming a second opening 124, which exposes a second area 114, on the solder resist layer 120, and forming a second surface treatment layer 140 on the second area 114.

Here, the first area 112 and the second area 114 refer to conductive portions (for example, some portions of a wire bonding pad, a bump pad and a circuit pattern) on which a surface treatment process is performed on the surfaces thereof by not being covered by the solder resist layer 120 and exposed to the outside.

In the present embodiment, the first surface treatment layer 130 to be formed on the first area 112 and the second surface treatment layer 140 to be formed on the second area 114 are separately formed through independent processes.

Here, the first surface treatment layer 130 can be formed by way of electroless plating. Accordingly, the manufacturing process can be abbreviated, compared to the conventional electroplating process, thus saving the production cost and shortening the production time. Moreover, since a plated bus-line is not required, the circuit can be designed with a greater degree of freedom, and a noise that can be caused by a residual object of the plated bus-line can be prevented from occurring.

As a result, in the present embodiment, printed circuit boards for semiconductor package requiring various types of surface treatment, for example, a printed circuit board for semiconductor package to which various types of connection such as wire bonding and flip-chip bonding are employed, can be implemented more easily and accurately.

Below, each respective process will be described in more detail by referring to FIGS. 9 to 14.

Figure 10:
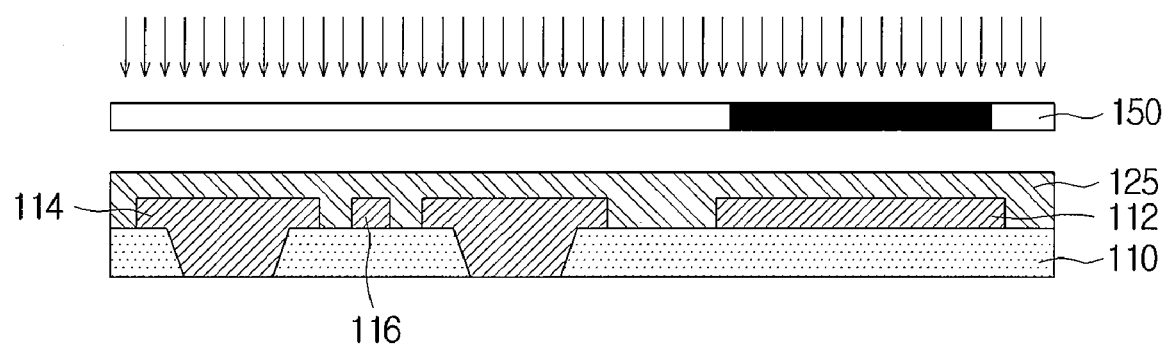
FIGS. 10 to 14 are cross-sectional views illustrating each respective process of a method of manufacturing a printed circuit board in accordance with an embodiment of the present invention.

First, as illustrated in FIG. 10, the insulation layer 110 on which the first area 112 and the second area 114 are formed is provided (S110). A circuit pattern 116, the first area 112 and the second area 114 are formed on the insulation layer 110.

In this embodiment, a pad for wire bonding (that is, a pad for connecting a semiconductor chip to the printed circuit board 100 by using a wire made of a material, for example, gold, silver or copper) is provided as the first area 112, and a bump pad for flip-chip connection (that is, a bump pad for connecting another semiconductor chip to the printed circuit board 100 by using, for example, a solder bump) is provided as the second area 114. However, the present invention is not limited to this embodiment, and the first area 112 and the second area 114 can be, for example, some portions of circuit patterns or pads for surface-mount.

Figure 11:
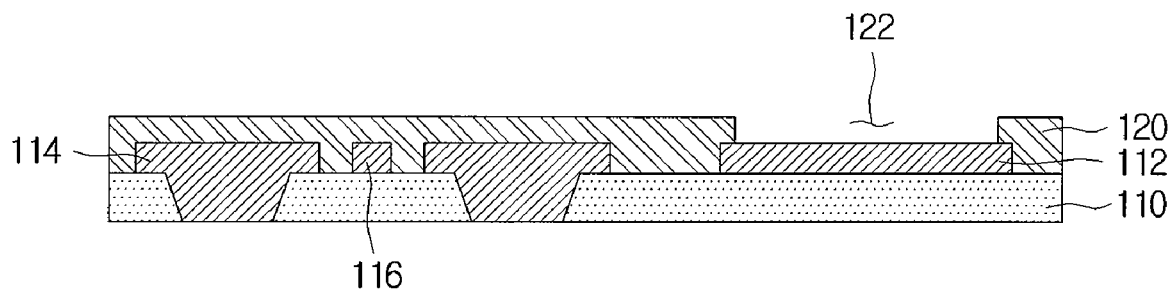

Next, as illustrated in FIGS. 10 and 11, the solder resist layer 120 having the first opening 122, which exposes the first area 112, formed thereon is formed on the insulation layer 110 (S120). A process of forming the solder resist layer 120 having the first opening 122 formed thereon by way of photolithography will be further described below.

First, as illustrated in FIG. 10, after a photosensitive substance layer 125 is formed on the insulation layer 110 so as to cover the circuit pattern 116, the first area 112 and the second area 114, exposing and developing processes are performed by using a mask 150 so that the solder resist layer 120 having the first opening 122 corresponding to the position of the first area 112 can be formed.

By forming the first opening 122 using a photolithography process to expose the first area 112 only to the outside, the first surface treatment layer 130 can be formed on the first area 112 only by a desired surface treatment method, without using an additional plating resist for covering the second area 114.

If, unlike the present embodiment, the first surface treatment layer 130 is to be formed on the first area 112 only after exposing both the first area 112 and the second area 114, the second area 114 has to be covered by using a plating resist. In the case of the plating resist, however, if electroless plating is employed, the plating resist may not survive in a plating solution, and the process may take longer.

In this embodiment, however, the plating resist itself is not required, and thus the first surface treatment layer 130 can be formed only by way of electroless plating. In this case, the manufacturing process can become simpler than employing electroplating, thus saving the production cost and time. Moreover, since a plated bus-line for electroplating is not required, circuits can be designed with a greater degree of freedom, and a noise that can be caused by a residual plated bus-line can be prevented from occurring.

Figure 12:
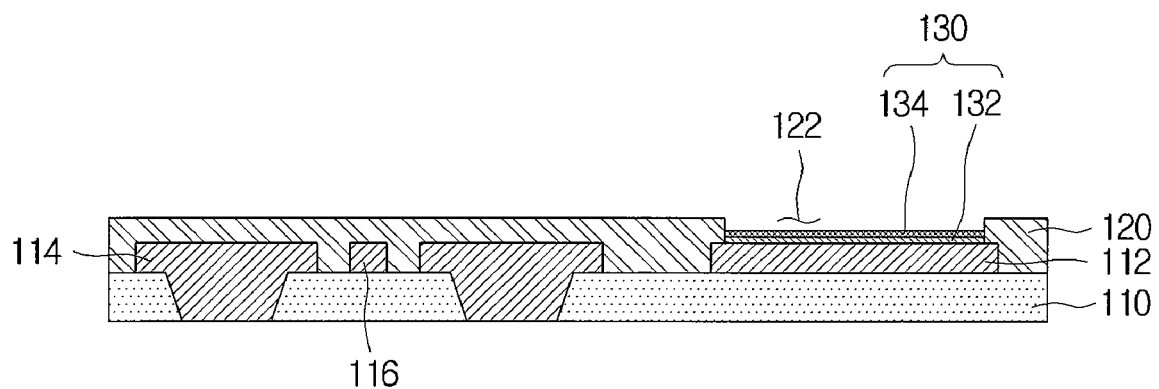

Next, as illustrated in FIG. 12, the first surface treatment layer 130 is formed on the first area 112 inside the first opening 122 (S130).

Through the above processes, the first area 112 is exposed to the outside through the first opening 122, but the second area 114 is still covered by the solder resist layer 120. Accordingly, if electroless plating is employed, the solder resist layer 120 can also function as a plating resist, and thus the first surface treatment layer 130 constituted by, for example, a nickel layer 132 and a gold layer 134 can be formed on the first area 112 only.

In the present embodiment, since the solder resist layer 120 can temporally function as a plating resist, an additional plating resist itself is not needed. Accordingly, an electroless plating process for selectively plating the first area 112 only can be performed more easily and effectively.

Meanwhile, the first surface treatment layer 130 can be formed by using methods such as an electrolytic nickel-gold plating method, an electroless nickel immersion gold (ENIG) method, an electroless nickel autocatalytic gold (ENAG) method, an electroless nickel electroless palladium immersion gold (ENEPIG) method, an electroless nickel immersion palladium immersion gold (ENIPIG) method, an immersion tin plating method and an organic solderability preservative (OSP) method.

Figure 13:
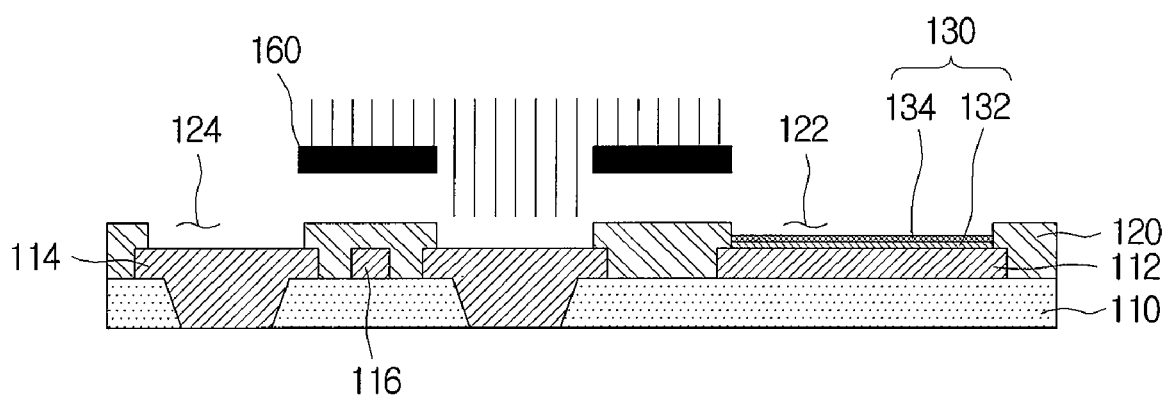

Next, as illustrated in FIG. 13, the second opening 124 that exposes the second area 114 is formed on the solder resist layer 120 (S140). The second opening 124 exposing the second area 114 to the outside can be formed on the solder resist layer 120 by using, for example, a direct etching method using a laser device 160.

By forming the second opening 124 corresponding to the position of the second area 114 by a separate, independent process after the first surface treatment layer 130 is formed, the second surface treatment layer 140 made of a material that is different from that of the first surface treatment layer 130 can be easily formed on the second area 114 inside the second opening 124, without regard to another plating resist.

Furthermore, alignment between the second area 114 and the second opening 124 can be improved by forming the second opening 124 through the use of a laser. In other words, if the second opening 124 is formed by way of exposing and developing, a defect may occur because of the eccentricity between the second area 114 and the second opening 124. In this embodiment, however, the second area 114 can be formed more finely and precisely since the second opening 124 is formed more precisely by using the laser device 160.

Figure 14:
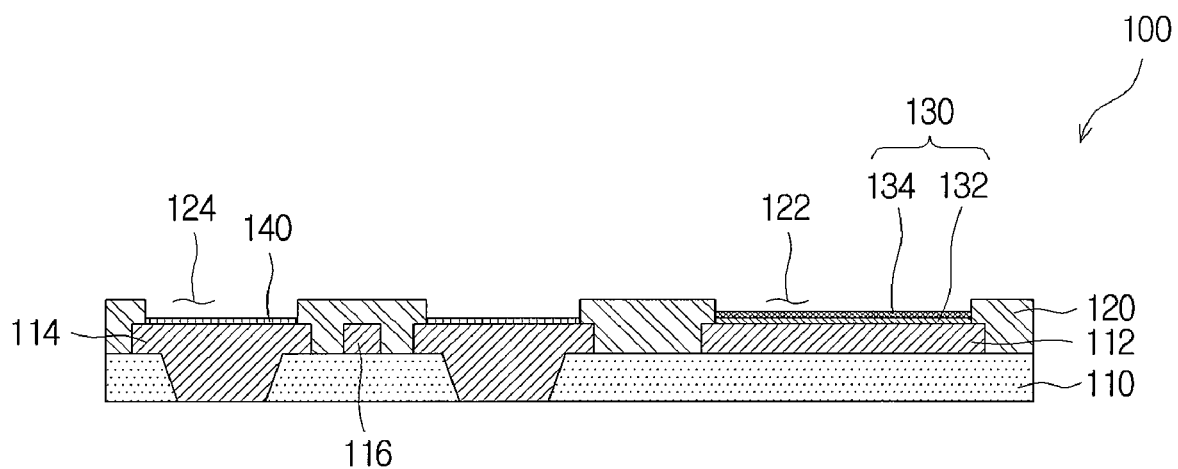

Next, as illustrated in FIG. 14, the second surface treatment layer 140 is formed on the second area 114 inside the second opening 124 (S150). Although the second surface treatment layer 140 can be formed by the same method used for the first surface treatment layer 130, a different method can be used to form the second surface treatment layer 140, depending on the design specifications.

In one example, the second surface treatment layer 140, for example, an organic solderability preservative layer, which is different from the first surface treatment layer 130 can be formed on the second area 114. As described above, in the present embodiment, since the process of forming the first surface treatment layer 130 is separate from the process of forming the second surface treatment layer 140, printed circuit boards for semiconductor package requiring various types of surface treatment, for example, a printed circuit board for semiconductor package to which wire bonding and flip-chip bonding are employed, can be implemented more easily and accurately.

Although the present embodiment presents an example in which the second surface treatment layer 140 is formed by way of OSP, it shall be apparent that methods such as an electrolytic nickel-gold plating method, an electroless nickel immersion gold (ENIG) method, an electroless nickel autocatalytic gold (ENAG) method, an electroless nickel electroless palladium immersion gold (ENEPIG) method, an electroless nickel immersion palladium immersion gold (ENIPIG) method and an immersion tin plating method can also be used.

While the spirit of the present invention has been described in detail with reference to a particular embodiment, the embodiments are for illustrative purposes only and shall not limit the present invention. It is to be appreciated that those skilled in the art can change or modify the embodiment without departing from the scope and spirit of the present invention.

As such, many embodiments other than that set forth above can be found in the appended claims.

What is claimed is:

1. A method of manufacturing a printed circuit board, the method comprising:
    providing an insulation layer having a first area and a second area formed thereon;
    forming a solder resist layer on the insulation layer, the solder resist layer having a first opening formed thereon, the first opening exposing the first area;
    forming a first surface treatment layer on the first area inside the first opening;
    after forming the first surface treatment layer, forming a second opening on the solder resist layer, the second opening exposing the second area; and
    forming a second surface treatment layer on the second area inside the second opening.

2. The method of claim 1, wherein each of the first area and the second area is one of a wire bonding pad, a bump pad and a circuit pattern.

3. The method of claim 1, wherein the forming of the second opening is performed by a laser.

4. The method of claim 1, wherein each of the first surface treatment layer and the second surface treatment layer is formed by one of an electrolytic nickel-gold plating method, an electroless nickel immersion gold (ENIG) method, an electroless nickel autocatalytic gold (ENAG) method, an electroless nickel electroless palladium immersion gold (ENEPIG) method, an electroless nickel immersion palladium immersion gold (ENIPIG) method, an immersion tin plating method and an organic solderability preservative (OSP) method.

5. The method of claim 4, wherein the first surface treatment layer and the second surface treatment layer are formed by methods that are different from each other.

\* \* \* \* \*